United States Patent [19]
Yuki et al.

[11] Patent Number: 5,466,957
[45] Date of Patent: Nov. 14, 1995

[54] TRANSISTOR HAVING SOURCE-TO-DRAIN NONUNIFORMLY-DOPED CHANNEL AND METHOD FOR FABRICATING THE SAME

[75] Inventors: Masaru Yuki; Kenichi Tanaka, both of Fukuyama, Japan

[73] Assignee: Sharp Kabushiki Kaisha, Osaka, Japan

[21] Appl. No.: 969,325

[22] Filed: Oct. 29, 1992

[30] Foreign Application Priority Data

Oct. 31, 1991 [JP] Japan .................................. 3-286646
Apr. 10, 1992 [JP] Japan .................................. 4-089179

[51] Int. Cl.⁶ ............................ H01L 29/10; H01L 29/78
[52] U.S. Cl. ...................... 257/344; 257/346; 257/408
[58] Field of Search ............................. 257/346, 408, 257/344

[56] References Cited

U.S. PATENT DOCUMENTS

| 4,649,629 | 3/1987 | Miller et al. | 257/408 |
| 4,957,824 | 7/1990 | Shinada | 21/306 |

FOREIGN PATENT DOCUMENTS

| 00833447 | 7/1983 | European Pat. Off. . | |
| 4-259258 | 9/1992 | Japan | 257/408 |

OTHER PUBLICATIONS

A Novel Source-to-Drain Nonuniformly Doped Chanel (NUDC) MOSFET for High Current Drivability and Threshold Voltage Controllability; pp. 391-394, IEDM, 1990.

*Primary Examiner*—Ngân V. Ngô
*Attorney, Agent, or Firm*—Nixon & Vanderhye

[57] ABSTRACT

A semiconductor device including a substrate of a first conductivity type, a gate electrode laminated thereon and a source and drain region of a second conductivity type formed in self-alignment manner in an upper portion of the substrate outside the gate electrode, the conductor device further including a high concentration layer of the first conductivity type in a channel region between the source and the drain and a low concentration layer of the first conductivity type between the high concentration layer and the source and drain region.

4 Claims, 9 Drawing Sheets

(PRIOR ART)
Fig. 6D

TRANSISTOR HAVING SOURCE-TO-DRAIN NONUNIFORMLY-DOPED CHANNEL AND METHOD FOR FABRICATING THE SAME

BACKGROUND OF THE INVENTION

1. Field of the Invention

The present invention relates to a semiconductor device and a method for fabricating the same. More specifically, the invention relates to a submicron MOSFET (Metal Oxide Semiconductor Field Effect Transistor) having so-called source-to-drain nonuniformly doped channel (NUDC) constitution where a channel region doped with an impurity of high concentration and another channel region doped with an impurity of low concentration are distributed between a source and drain of a MOS transistor, and a method for fabricating the same.

2. Related Art

Methods for forming a semiconductor device with the NUDC constitution have heretofore been reported, for example, by Y. Okumura et al. [see "A Novel Source-to-Drain Nonuniformly Doped Channel (NUDC) MOSFET for High Current Drivability and Threshold Voltage Controllability", pp. 391–394, IDEM90]. The method of an NUDC MOSFET fabrication disclosed by Y. Okumura is explained hereinbelow with reference to FIGS. 6(a), 6(b), 6(c) and 6(d).

Figure 6A:
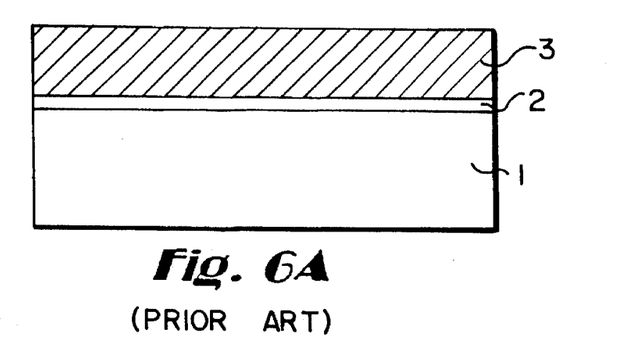
FIG. 6 is a series of schematic views illustrating a conventional method to fabricate a semiconductor device.

Referring initially to FIG. 6(a), a gate oxide 2 is formed on a p-type silicon substrate 1, and a polysilicon layer 3 doped with phosphorus is grown thereon by a Chemical Vapor Deposition (CVD) process.

Figure 6B:
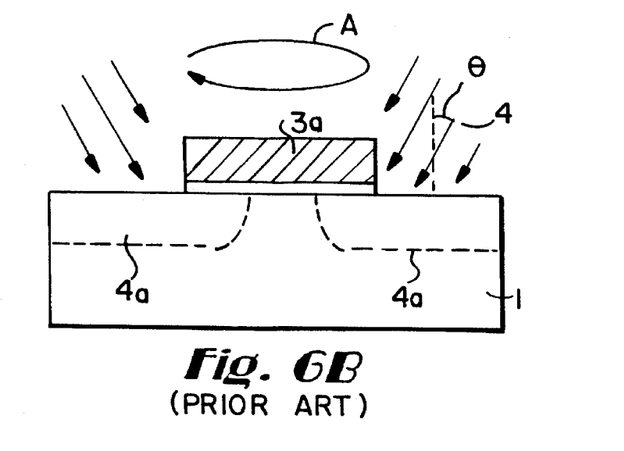

As shown in FIG. 6(b), a gate electrode 3a is formed into a predetermined pattern by well-known photo-lithography and etching processes. Oblique ion implantation of boron 4 at an incidence angle θ of 20°–40° and rotating in a direction A is performed to form a high concentration p-type NUDC layer 4a.

Figure 6C:
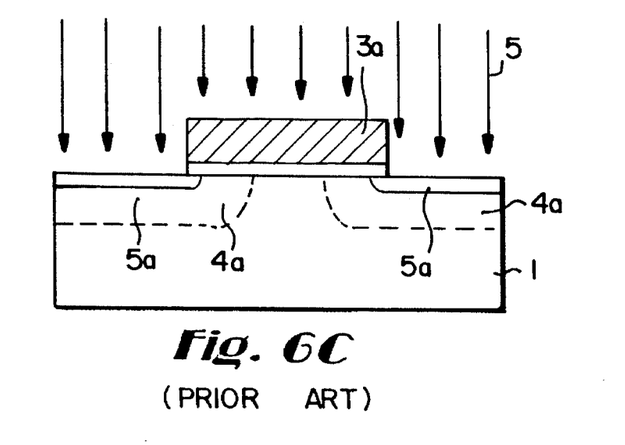
Figure 6D:
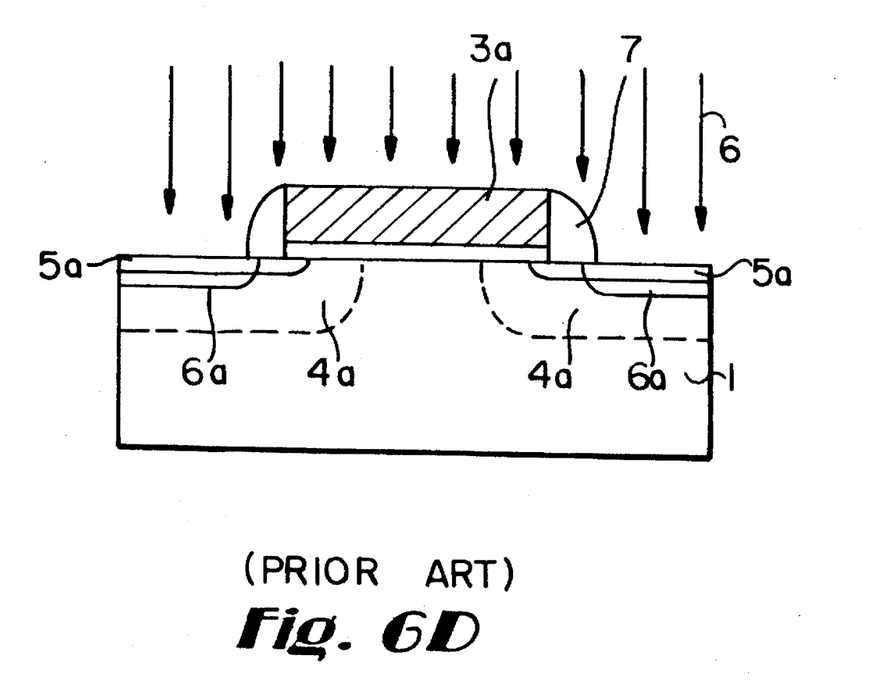

Referring to FIG. 6(c), after ion implantation of phosphorus 5 from just above, i.e, at an incidence angle of 0°, a low concentration n⁻-type layer 5a having lightly doped drain (LDD) constitution is provided on the above layer 4a. FIG. 6(d) shows that a side wall 7 is formed outside the gate electrode 3a. Oblique ion implantation of boron 6 at an incidence angle of 7° is carried out to form a high concentration n-type layer 6a as a source and a drain.

In the submicron n-type NUDC MOSFET fabricated in a manner as described above, the high concentration p-type layer 4a can prevent punch-through phenomenon between the source and drain so that short channel effect can also be suppressed.

Nevertheless, a disadvantage exists in the above prior art method in which before the formation of the source and drain region, doping of the high concentration p-type impurity is previously performed in a site intended to be the region. Thus, bonding pressure between the high concentration n-type impurity doped layer 6a and the high concentration p-type layer 4a is considerably decreased, facilitating current crowding effect. The result is that hot carrier effect is undesirably caused.

SUMMARY OF THE INVENTION

The present invention provides a semiconductor device comprising a substrate of a first conductivity type, a gate electrode stacked thereon, and a source and drain region of a second conductivity type formed in self-alignment manner in an upper portion of the substrate outside the gate electrode, the semiconductor device further comprising a high concentration layer of the first conductivity type in a channel region between a source and a drain of the region, and a low concentration layer f the first conductivity type between the high concentration layer and the region.

The invention also provides a method for fabricating a semiconductor device comprising:

(i) injecting an impurity of a first conductivity type in a channel region in an upper portion of a substrate of a first conductivity type to form a high concentration layer of the first conductivity type;

(ii) forming a gate electrode thereon and obliquely injecting an impurity of a second conductivity type, using the gate electrode as a mask, in an upper portion of the high concentration layer to form a low concentration layer of the first conductivity type; and (iii) injecting an impurity of the second conductivity type, using the gate electrode as a mask, in an upper portion of the substrate to form a source and drain region of the second conductivity type.

The invention also provides a method for fabricating a semiconductor device comprising:

(i) forming a gate electrode on a substrate of a first conductivity type and obliquely injecting an impurity of a first conductivity type, using said gate electrode as a mask, to form a low concentration layer and a high concentration layer of the first conductivity type; and (ii) injecting an impurity of the second conductivity type, using said gate electrode as a mask, in an upper portion of said substrate to form a source and drain region of the second conductivity type.

DESCRIPTION OF THE PREFERRED EMBODIMENTS

The present invention is hereinbelow detailed with reference to the preferred embodiments. It should be understood, however, that the invention is not limited to the specific details set forth in the embodiments.

In a preferred embodiment of the invention, a silicon substrate is used for a substrate of a first conductivity type, though other substrates may also be used. To make a p-type substrate, ions of B, In or the like, for example, are doped as an impurity whilst ions of P, As, Sb or the like are doped to make an n-type counterpart. In any case, the dose of such an impurity is $1\times10^{14}$–$1\times10^{16}$ ions/cm². These kinds of the ion are used as an impurity of a first or second conductivity type; that is to say, B, In or the like as a p-type impurity and P, As, Sb or the like as an n-type impurity.

According to the present invention, a semiconductor device is fabricated in the following manner:

(i) On a substrate of a first conductivity type, an impurity of the same type is doped in a dose of $5\times10^{12}$–$2\times10^{13}$ ions/cm$^2$ and at an energy of 20–50 keV in a channel region and its vicinities to form a high concentration layer of the first conductivity type;

(ii) A gate oxide in a thickness of 0.009–0.012 μm is formed on the high concentration layer by thermal oxidization at about 850°–950° C.; a layer of polysilicon, tungsten silicide or the like is grown thereon in a thickness of 0.2–0.3 μm by a CVD process, which layer is subjected to well-known photolithography and etching processes to form a gate electrode on the gate oxide; next, in an upper portion of the high concentration layer of the first conductivity type, oblique rotating ion implantation of an impurity of the second conductivity type rotating in one direction, i.e., counter doping, is performed in a dose of about $5\times10^{11}$–$1\times10^{13}$ ions/cm$^2$, at 20–150 key and an incidence angle of 7°–60° to form a low concentration NUDC layer of the first conductivity type; and (iii) On the same low concentration NUDC layer an impurity of the second conductivity type is doped in a dose of $1\times10^{15}$–$5\times10^{15}$ ions/cm$^2$, at 40–60 keV and an incidence angle of 0°–7° to form a high concentration layer of the second conductivity type.

Alternatively, the present invention provides a fabricating method of a semiconductor device as stated below:

(i) In an upper portion of a first-conductivity type substrate, an impurity of the same type is doped in a dose of $5\times10^{12}$–$2\times10^{13}$ ions/cm$^2$ and at 20–50 keV in a channel region and its vicinities to form a high concentration layer of the first conductivity type;

(ii) A gate oxide in a thickness of 0.009–0.012 μm is formed on the high concentration layer by thermal oxidization of about 850°–950° C.; further, a layer of polysilicon, tungsten silicide or the like is grown in a thickness of 0.2–0.3 μm by a CVD process, which layer is subjected to well-known photolithography and etching processes to form a gate electrode on the gate oxide; and next, to form a low concentration NUDC layer of the first conductivity type, oblique rotating ion implantation of a second-conductivity type impurity rotating in one direction, i.e., counter doping, in an upper portion of the high concentration layer of the first conductivity type is performed in a dose of about $5\times10^{11}$–$1\times10^{13}$ ions/cm$^2$, at an energy of 20–150 keV and an incidence angle of 7°–60°; and (iii) On the low concentration NUDC layer an impurity of the second conductivity type is doped in a dose of $1\times10^{13}$–$5\times10^{13}$ ions/cm$^2$, at 30–50 keV and an incidence angle of 0° to form a low concentration layer of the second conductivity type for use as a low concentration region of LDD (lightly doped drain); and (iv) Further, a layer of SiO$_2$, Si$_3$N$_4$ or the like for use as a side wall is grown thereon in a thickness of 0.1–0.3 μm by a method such as a CVD process, which layer is subjected to well-known etching process to form the side wall; finally an impurity ion of the second conductivity type is doped in a dose of $1\times10^{15}$–$5\times10^{15}$ ions/cm$^2$, at an energy of 40–80 keV and an incidence angle of 0°–7°, using such gate electrode and side wall as a mask to form a high concentration layer of the second conductivity type.

With this method, after formation of a low concentration NUDC layer of a first conductivity type, a side wall is provided around a gate electrode, and formed are both of a high concentration layer of the second conductivity type for source and drain, and a low concentration LDD layer of the same type.

According to the present invention, before formation of a gate electrode, a high concentration layer of a first conductivity is formed. Such a high concentration layer can be formed by oblique implantation of the first conductivity type impurity after the formation. In that case, the impurity is doped in a dose of about $1\times10^{12}$ to $1\times10^{13}$ ions/cm$_2$, at an energy of 100–200 keV and an incidence angle of 30°–60° to form a low concentration layer of the first conductivity type in an upper portion of a substrate and also the high concentration layer of the first conductivity type below the low concentration layer.

Moreover, by doping the impurity in a source or a drain, the above high concentration layer can be formed below the source or the drain, accordingly.

If an incidence angle is below 30° or an injection energy is below 100 keV, the high concentration layer reaches or extends too close to the source and drain to provide no sufficient bonding pressure If the angle is above 60°, the same layer reaches or extends too close to the opposite of the doped source or drain to provide no sufficient bonding pressure. If the injection energy is above 200 keV, the high concentration layer cannot be formed in a channel region.

In an NUDC constitution of the invention, a low concentration NUDC layer of the first conductivity type formed in a channel region of the semiconductor substrate of the first conductivity type is also formed beneath the source and drain which is a high concentration layer of the second conductivity type. So, the width of a depletion layer is likely to increase, thus decreasing a parasitic capacity. Consequently, speed of response in a product is improved. Furthermore, such NUDC constitution has an effect of reducing concentration of electric field, thus providing an excellent semiconductor device.

The invention will be detailed with reference to the following specific examples.

EXAMPLE 1

Figure 1A:
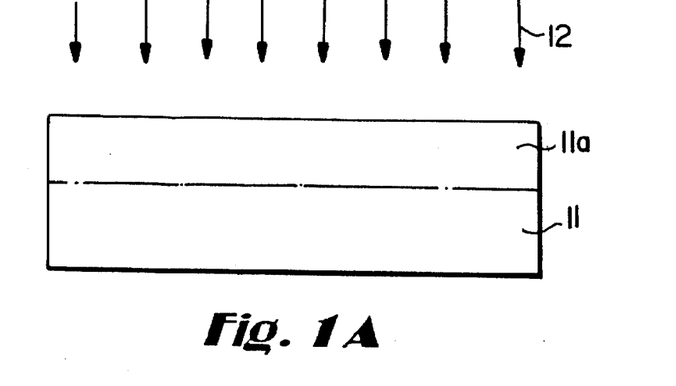
FIG. 1(a) to 1(d) are a series of schematic views illustrating fabricating processes for a semiconductor device for a first embodiment of the invention.

Referring initially to FIG. 1(a), boron ions 12 as an impurity of a first conductivity type were implanted in a dose of $1.0\times10^{13}$ ions/cm$^2$ and at 35 keV to form a high concentration p-type layer 11a on a p-type silicon substrate 11.

Figure 1B:
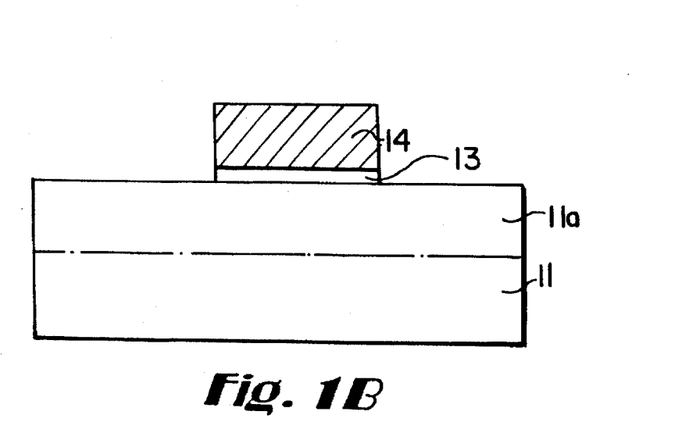

Then, as shown in FIG. 1(b), on the silicon substrate 11, an SiO$_2$ layer was formed in a thickness of 0.012 μm by thermal oxidation of 900° C. Sequentially, a polysilicon layer doped by a CVD method with phosphorus ions in a dose of $5\times10^{15}$ ions/cm$^2$ was formed in a thickness of 0.25 μm. Further, a gate oxide 13 and a gate electrode 14 were formed thereon by photolithography and etching processes.

Figure 1C:
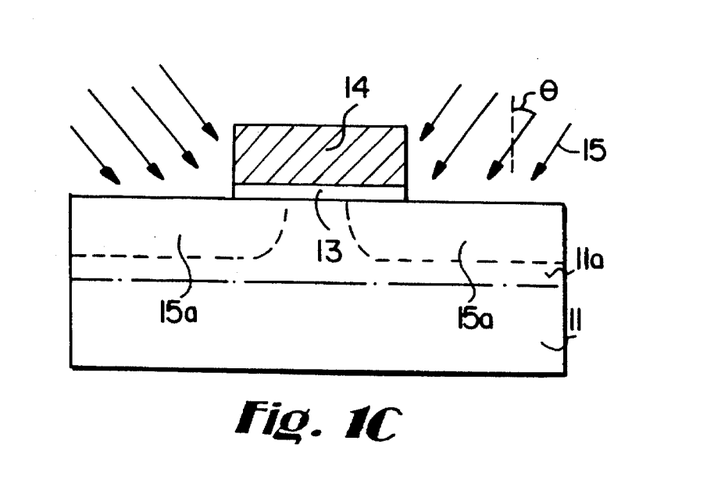

Next, ion implantation of phosphorus 15 as an impurity of a second conductivity type rotating in a direction θ as shown in FIG. 1(c), was performed in a dose of $5\times10^{12}$ ions/cm$^2$, at an incidence angle of 30° and at 80 keV to form a low concentration p-type NUDC layer 15a as a first low conductivity layer.

Figure 1D:
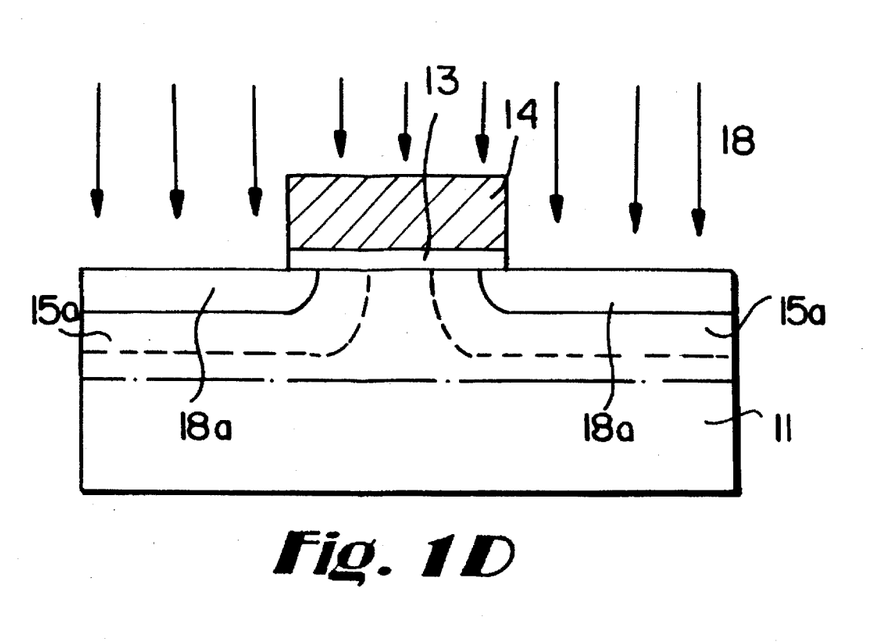

Then, as shown in FIG. 1(d), in order to further form an n$^+$ layer 18a as a second high concentration conductivity layer, arsenic ions 17 as an impurity of the second conductivity type were implanted in a dose of $3.0 \times 10^{15}$ ions/cm$^2$, at 50 keV and an incidence angle of 0°, using the gate electrode 14 as a mask.

EXAMPLE 2

Figure 2A:
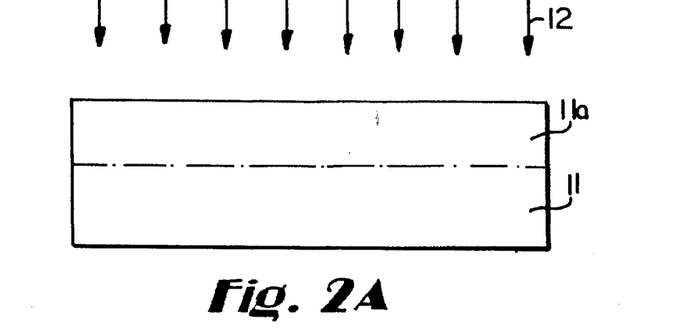
FIGS. 2(a) to 2(e) are a series of schematic views illustrating fabricating processes for a semiconductor device for a second embodiment of the invention.

Referring to FIG. 2(a), boron ions 12 as an impurity of a first conductivity type were implanted in a dose of $1.0 \times 10^{13}$ ions/cm$^2$ and at 35 keV to form a high concentration p-type layer 11a on a p-type silicon substrate 11.

Figure 2B:
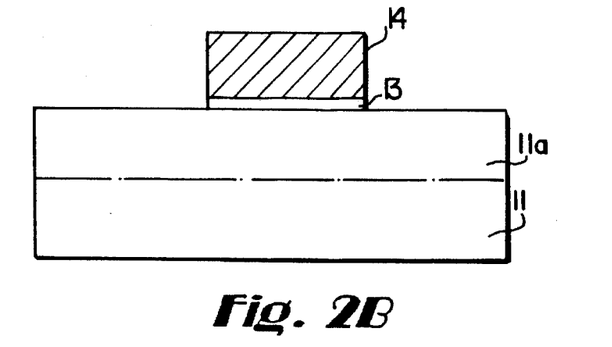

Then, on the silicon substrate 11, an SiO$_2$ layer was formed in a thickness of 0.012 μm by thermal oxidation of 900° C. FIG. 2(b) shows that a polysilicon layer doped by a CVD method with phosphorus ions in a dose of $5.0 \times 10^{15}$ ions/cm$^2$ was formed in a thickness of 0.25 μm. Further, a gate oxide 13 and a gate electrode 14 were formed thereon by photolithography and etching processes.

Figure 2C:
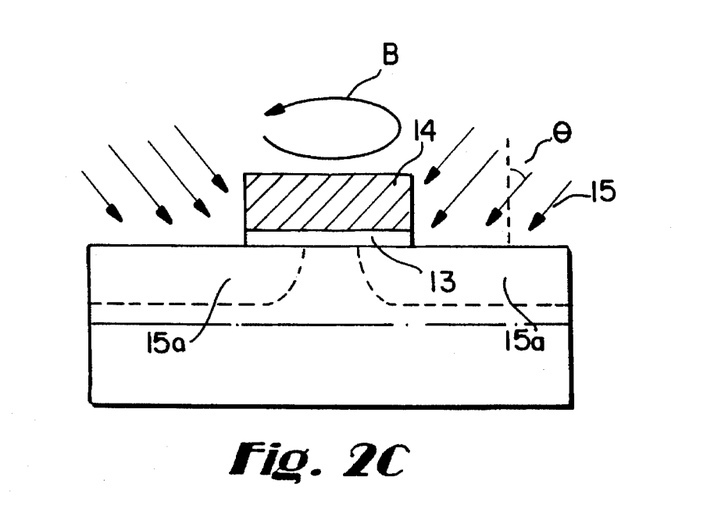

Next, phosphorus ions 15 as a second conductivity impurity rotating in a direction θ as shown in FIG. 2(c) were implanted in a dose of $5 \times 10^{12}$ ions/cm$^2$ and at an incidence angle of 30° to form a low concentration p-type NUDC layer 15a as a first low conductivity layer.

Figure 2D:
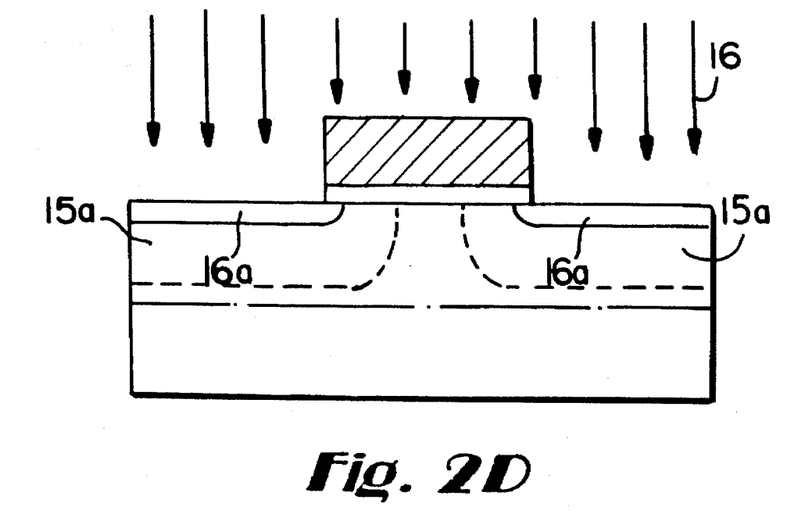

Then, as shown in FIG. 2(d), arsenic ions 16 as an impurity of the second conductivity type were implanted in a dose of $2.0 \times 10^{13}$ ions/cm$^2$, at 30 keV and an incidence angle of 0° to form a lightly doped drain n$^-$-type layer 16a as a low concentration layer of the second conductivity type in an upper portion of a low concentration p-type NUDC layer 15a.

Figure 2E:
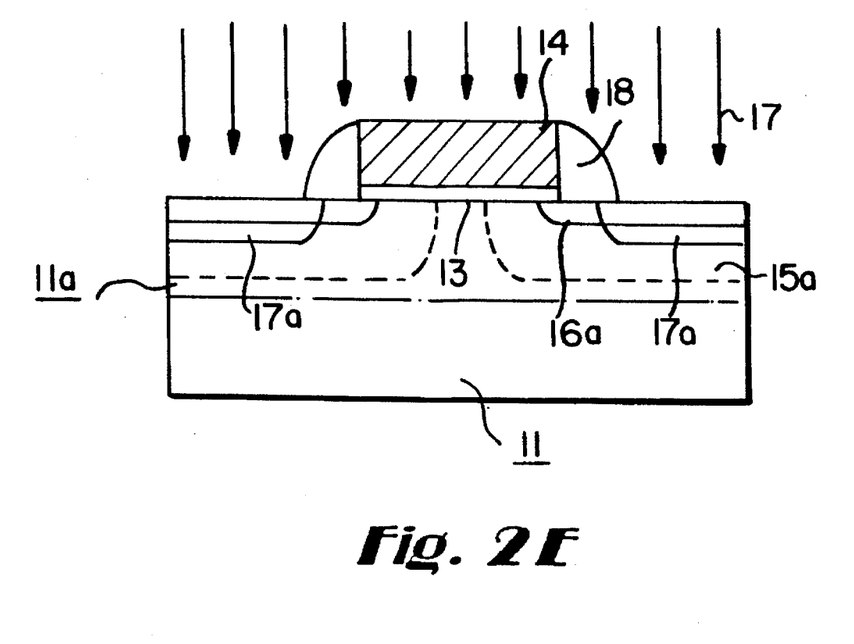

FIG. 2(e) shows that an SiO$_2$ layer was laminated in a thickness of 0.15 μm by a CVD method, a side wall 18 being formed around the gate electrode 14 by etching. Next, arsenic ions 17 as an impurity of the second conductivity type were implanted in a dose of $3.0 \times 10^{15}$ ions/cm$^2$ and at an incidence angle of 0°, using the gate electrode 14 and side wall 18 as a mask to form an n$^+$-type layer 17a of the source and drain as a high concentration layer of the second conductivity type.

EXAMPLE 3

Figure 3A:
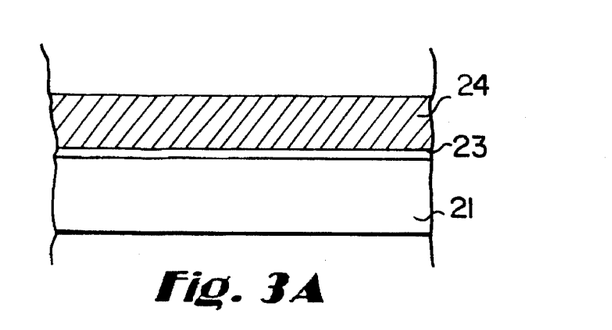
FIGS. 3(a) to 3(d) are a series of schematic views illustrating fabricating processes for a semiconductor device for a third embodiment of the invention.

Referring to FIG. 3(a), on a p-type silicon substrate 21, an SiO$_2$ layer was formed in a thickness of 0.012 μm by thermal oxidation of 900° C. A polysilicon layer doped by a CVD method with phosphorus ions in a dose of $5 \times 10^{15}$ ions/cm$^2$ was formed in a thickness of 0.25 μm.

Further, a gate oxide 23 and a gate electrode 24 were formed thereon by photolithography and etching processes.

Figure 3B:
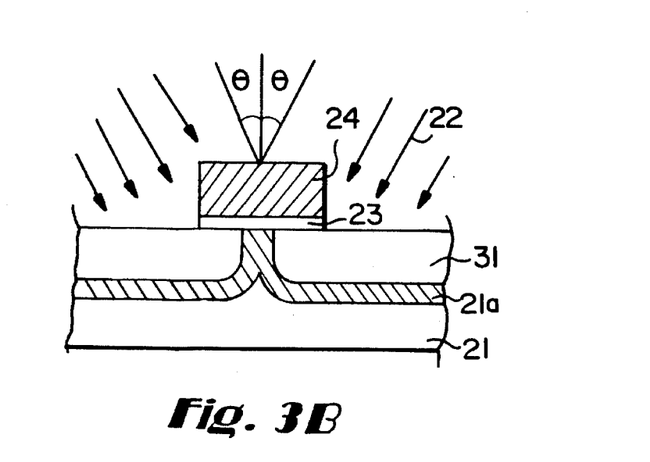

FIG. 3(b) shows that boron ions 22 as an impurity of a first conductivity type were implanted from both directions of the source and drain in a dose of $10 \times 10^{13}$ ions/cm$^2$ and at 150 keV and an incidence angle of 30° to 60° using the gate electrode as a mask to form a high concentration p-type layer 21a. With this ion implantation, a low concentration layer 31 was also formed on the high concentration layer 21a.

Figure 3C:
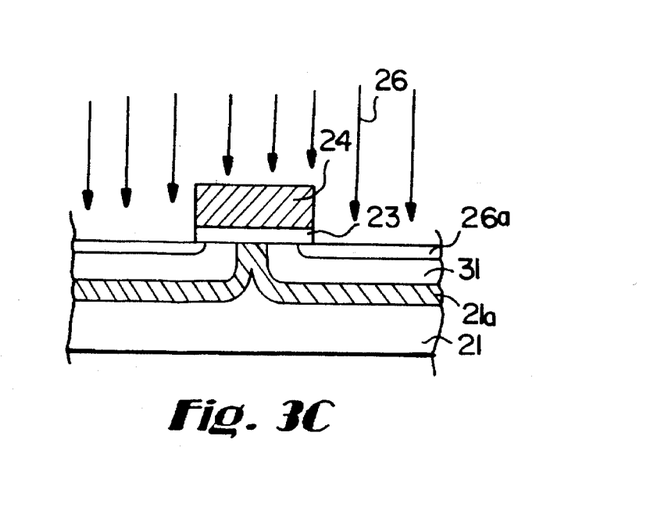

Then, as shown in FIG. 3(c), arsenic ions 26 as an impurity of the second conductivity type were implanted in a dose of $2 \times 10^{13}$ ions/cm$^2$, at 30 keV and an incidence angle of 0° to form a lightly doped drain n$^-$-type layer 26a as a low concentration layer of the second conductivity type in an upper portion of a low concentration p-type NUDC layer 26a.

Figure 3D:
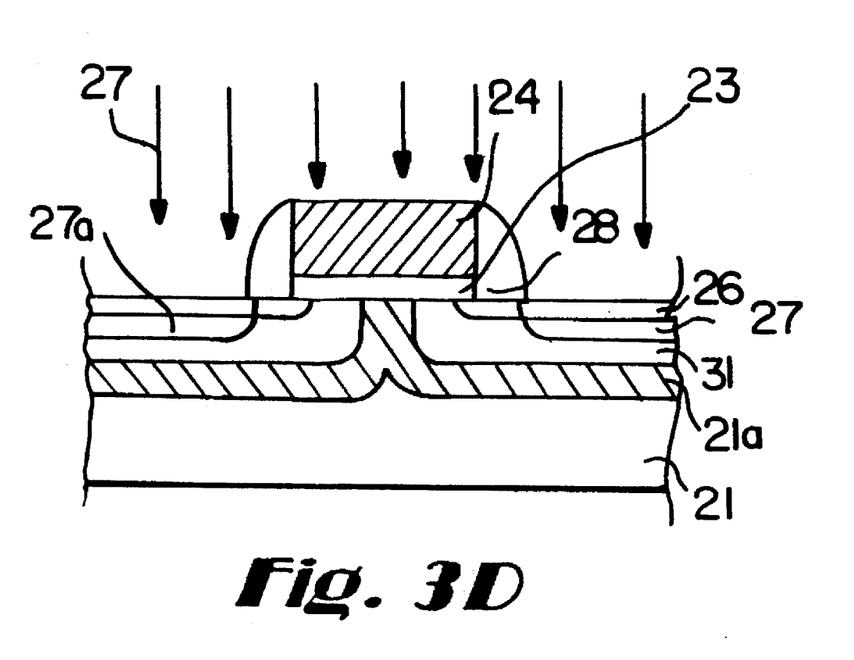

FIG. 3(d) shows that an SiO$_2$ layer was laminated in a thickness of 0.15 μm by a CVD method. A side wall 28 was then formed around the gate electrode 24 by photolithography and etching. Next, arsenic ions 27 as an impurity of the second conductivity type were implanted in a dose of $3 \times 10^{15}$ ions/cm$^2$ and at an incidence angle of 0°, using the gate electrode 24 and side wall 28 as a mask to form an n$^+$-type layer 27a of the source and drain as a high concentration layer of the second conductivity type.

EXAMPLE 4

Figure 4:
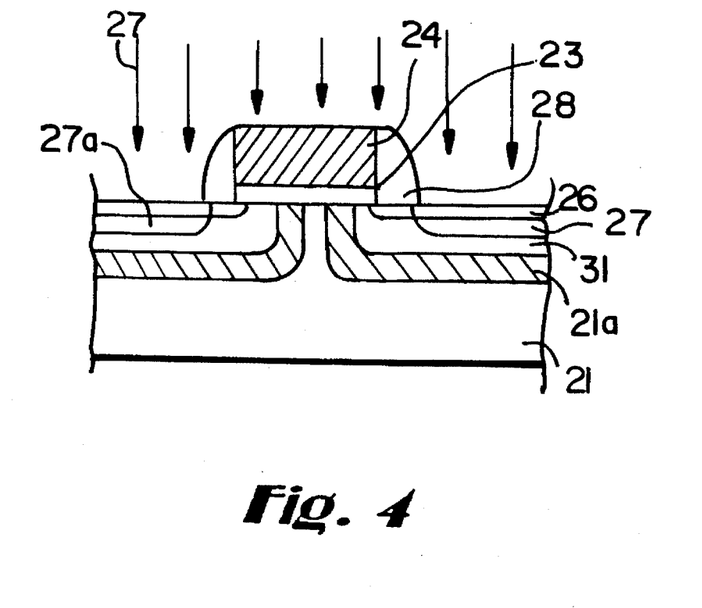
FIG. 4 is a schematic view illustrating a fourth embodiment of the invention.

A semiconductor device shown in FIG. 4 was formed in the same manner as in the Example 3 with the exception that boron ions 22 as an impurity of a first conductivity type were implanted in a dose of $1.0 \times 10^{13}$ ions/cm$^2$ and to form a high concentration p-type layer 21a as a high concentration layer of the first conductivity type. In this example, the incidence angle was set at smaller than in Example 3 and the injection energy was also lower than in Example 3.

EXAMPLE 5

Figure 5:
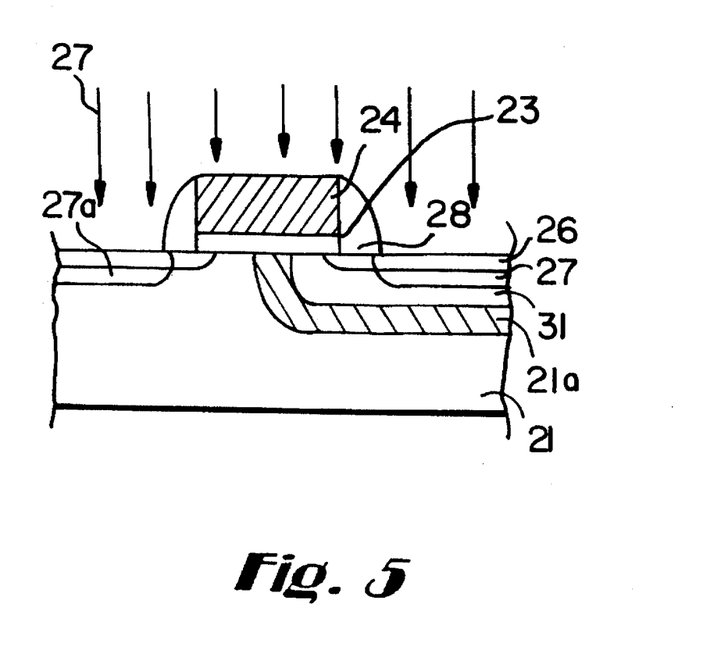
FIG. 5 is a schematic view illustrating a fifth embodiment of the invention.

A semiconductor device shown in FIG. 5 was formed in the same manner as in the Example 3 with the exception that to form a high concentration p-type layer 21a as a high concentration layer of the first conductivity type, boron ions 22 in a dose of $1 \times 10^{13}$ ions/cm$^2$ and at 150 keV were implanted in any one of the source and the drain using the gate electrode 24 as a mask.

Although the high concentration p-type NUDC layer was formed directly on the substrate in the above-mentioned Examples 1 to 5, such a layer can also be formed on a P-well formed on the substrate.

What is claimed is:

1. A semiconductor device comprising:

a substrate of a first conductivity type, an insulating film stacked on the substrate, a gate electrode stacked on the insulating film, source and drain regions of a second conductivity type in a surface of the substrate and in proximity to the gate electrode, a high concentration layer of the first conductivity type having an impurity concentration higher than that of the substrate and surrounding the entire drain region up to the surface of the substrate, and a low concentration layer of the first conductivity type lying between the drain region and the high concentration layer, having an impurity concentration lower than that of the high concentration layer and surrounding the entire drain region up to the surface of the substrate.

2. A semiconductor device as in claim 1 in which the drain region comprises a first region of said second conductivity type and a low concentration layer of the second conductivity type having an impurity concentration lower than that of the first region of the drain region.

3. A semiconductor device as in claim 1 in further comprising:

a high concentration layer of the first conductivity type having an impurity concentration higher than that of the substrate and surrounding the entire source region up to the surface of the substrate, and a low concentration layer of the first conductivity type lying between the source region and the high concentration layer surrounding the source region, having an impurity concentration lower than that of the high concentration layer, and surrounding the entire source region up to the surface of the substrate.

4. A semiconductor device as in claim 3 in which the source region comprises an first region of said second conductivity type and a low concentration layer of the second conductivity type having an impurity concentration lower than that of the first region of the source region.

* * * * *